United States Patent [19]

Marko et al.

[11] Patent Number: 5,041,976
[45] Date of Patent: Aug. 20, 1991

[54] DIAGNOSTIC SYSTEM USING PATTERN RECOGNITION FOR ELECTRONIC AUTOMOTIVE CONTROL SYSTEMS

[75] Inventors: Kenneth A. Marko, Ann Arbor; John V. James, Walled Lake; James M. Dosdall, Grosse Ile, all of Mich.

[73] Assignee: Ford Motor Company, Dearborn, Mich.

[21] Appl. No.: 399,683

[22] Filed: Aug. 28, 1989

Related U.S. Application Data

[63] Continuation of Ser. No. 353,726, May 18, 1989, abandoned.

[51] Int. Cl.$^5$ .............................................. G06F 15/20
[52] U.S. Cl. ............................... 364/424.03; 364/513; 364/431.04
[58] Field of Search ....................... 364/424.01, 424.03, 364/431.02, 550, 551.01, 575, 578, 431.03, 424.04, 431.11, 513; 73/117.2, 117.3, 116; 307/201

[56] References Cited

U.S. PATENT DOCUMENTS

| | | | |
|---|---|---|---|
| 3,950,733 | 4/1976 | Cooper et al. | 364/900 |
| 4,125,894 | 11/1978 | Cashel et al. | 364/442 |
| 4,128,005 | 12/1978 | Arnston et al. | 73/117.3 |
| 4,215,404 | 7/1980 | Bukhtiyarov et al. | 364/431.04 |
| 4,228,679 | 10/1980 | Alt et al. | 73/117.3 |
| 4,234,921 | 11/1980 | Kinoshita et al. | 364/431.01 |
| 4,252,013 | 2/1981 | Hyanova et al. | 73/117.3 |
| 4,254,474 | 3/1981 | Cooper et al. | 364/900 |
| 4,270,174 | 5/1981 | Karlin et al. | 364/431.12 |
| 4,295,363 | 10/1981 | Buck et al. | 73/117.3 |
| 4,319,331 | 3/1982 | Elbaum et al. | 382/60 |
| 4,326,259 | 4/1982 | Cooper et al. | 364/715.11 |
| 4,375,672 | 3/1983 | Kato et al. | 364/431.04 |
| 4,394,742 | 7/1983 | Crummer et al. | 364/487 |
| 4,418,388 | 11/1983 | Allgor et al. | 364/431.01 |
| 4,424,709 | 1/1984 | Meier, Jr. et al. | 73/117.3 |
| 4,566,073 | 1/1986 | Zwicke | 73/117.3 |
| 4,730,259 | 3/1988 | Gallant | 364/513 |
| 4,760,604 | 7/1988 | Cooper et al. | 382/15 |
| 4,773,028 | 9/1988 | Tallman | 364/550 |
| 4,796,206 | 1/1989 | Boscove et al. | 364/551.01 |
| 4,839,811 | 6/1989 | Kanegae et al. | 73/116 |
| 4,849,894 | 7/1989 | Probst | 364/424.03 |
| 4,866,635 | 9/1989 | Kahn et al. | 364/513 |
| 4,912,655 | 3/1990 | Wood | 364/513 |

OTHER PUBLICATIONS

"Empirical and Functional Knowledge in an Expert System for Fault Diagnosis", G. Armano et al., International Workshop on Artifical Intelligence for Industrial Applications 1988, pp. 109–114.

"Failure Detection Algorithms Applied to Control System Design for Improved Diagnostics and Reliability", SAE Technical Paper Series #880726 (1988).

"Microprocessor Based Data Acquisition for Analysis of Engine Performance", SAE Technical Paper Series #870386 (1987).

Philip D. Wasserman; Neural Computing-Theory and Practice 1989, pp. 43–56.

Nestor Development System (NDS 1000) Reference Manual, 1987, pp. 1.1 to 6.8.

*Primary Examiner*—Parshotam S. Lall
*Assistant Examiner*—Michael Zanelli
*Attorney, Agent, or Firm*—Mark Mollon; Paul K. Godwin

[57] ABSTRACT

A system is disclosed for diagnosing faults in electronic control systems wherein a large volume of information is exchanged between the electronic control processor and a mechanical system under its control. The data is acquired such that parameter vectors describing the system operation are formed. The vectors are provided to a pattern recognition system such as a neural network for classification according to the operating condition of the electronically controlled system. For diagnosis of electronically controlled engine operation, the parameters included in the vectors correspond to individual firing events occurring in the engine operating under a predetermined condition. The diagnostic system can be implemented as a service tool in an automotive service bay or can be implemented within the on-board electronic control system itself.

35 Claims, 4 Drawing Sheets

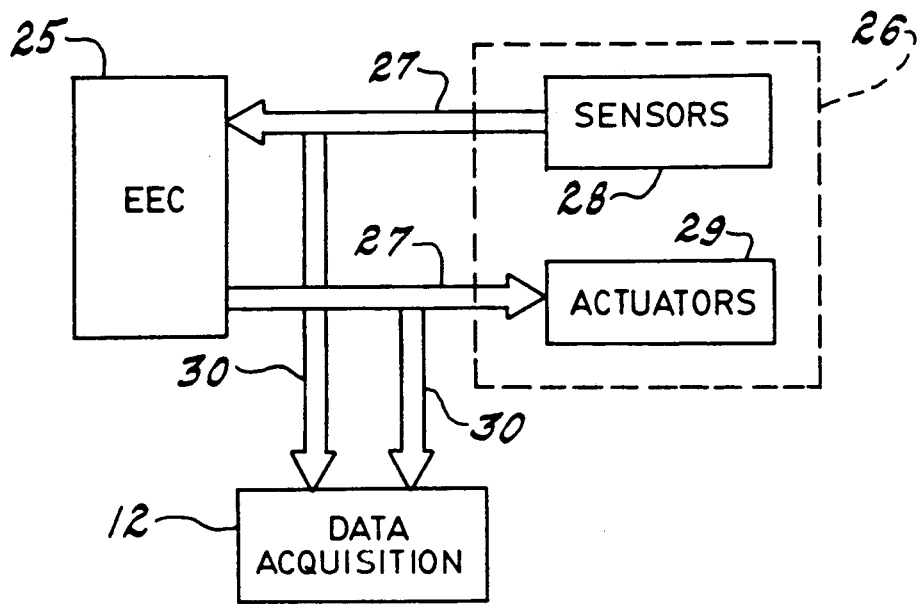
Fig. 3
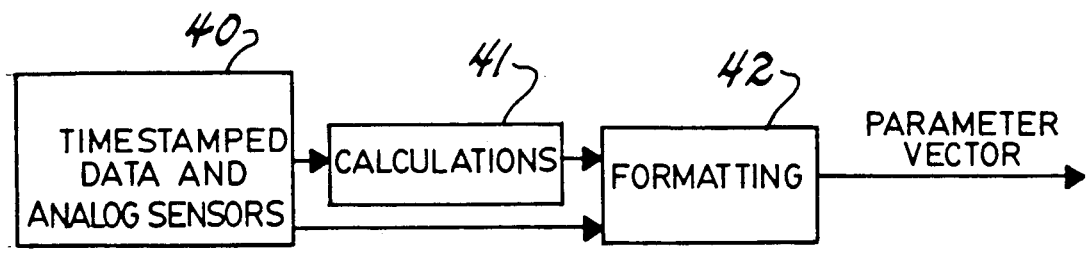
Fig. 5
$$X1 = (x_{1,1}, x_{1,2}, x_{1,3}, \ldots, x_{1,n})$$
$$X2 = (x_{2,1}, x_{2,2}, x_{2,3}, \ldots, x_{2,n})$$
$$\vdots$$
$$Xm = (x_{m,1}, x_{m,2}, x_{m,3}, \ldots, x_{m,n})$$
Fig. 6

| FOR FAULT C1 | FOR FAULT C2 | | FOR FAULT Cy |
|---|---|---|---|
| X1 , C1 | X1 , C2 | | X1 , Cy |
| X2 , C1 | X2 , C2 | .... | X2 , Cy |
| X3 , C1 | X3 , C2 | | X3 , Cy |
| ⋮ | ⋮ | | ⋮ |
| Xm, C1 | Xm, C2 | | Xm, Cy |

DIAGNOSTIC SYSTEM USING PATTERN RECOGNITION FOR ELECTRONIC AUTOMOTIVE CONTROL SYSTEMS

This application is a continuation of application Ser. No. 07/353,726, filed May 18, 1989, now abandoned.

BACKGROUND OF THE INVENTION

The present invention relates in general to the identification of the operating condition of an internal combustion engine including fault conditions in the engine, and more specifically to the use of a pattern recognition system examining engine operating parameters to identify specific fault conditions in the engine.

Automotive control systems for internal combustion engines can include an electronic engine control for improved reliability, advanced functionality, and low cost. A typical electronic system includes a master engine controller and a plurality of sensors and actuators incorporated into the powertrain of a vehicle. The master engine controller processes data from the sensors using look-up tables and complex algorithms in order to determine appropriate commands for the actuators. For example, engine position, engine speed, throttle position, and exhaust gas oxygen content can be monitored in order to determine a proper spark timing and dwell for engine operation. The particular strategy employed is designed to achieve compliance with federal emission regulations while optimizing fuel economy and powertrain performance.

In addition to engine controls, several other automotive systems currently employ or are candidates for electronic controls. Such systems include anti-lock brakes, drive by wire systems, and transmission control.

Operation of these electronic control systems must be highly reliable for safety reasons. When a fault develops, it must be possible to trace the cause of the fault to the plant (i.e., powertrain), the controller, or its sensors or actuators.

Due to the inherent complexity of electronic control systems, the task of diagnosing a fault becomes very difficult. Therefore, a great deal of effort has been expended in searching for diagnosis methods which require a minimum of skill or knowledge of the service technician.

Prior art attempts to provide electronic engine control fault diagnosis have involved computerization in order to minimize the skill required to perform the diagnosis. For instance, a data acquisition system can be used to provide engine operating information to a computer which compares the information to prespecified normal data. The measured values are compared with preset reference values in order to find discrepancies which indicate possible faults. Some systems also apply specific algorithms to measured values in order to determine specific engine characteristics. For example, the computer may determine an integrated average over time or may extract particular features of a waveform for analysis.

Several prior art engine diagnosis systems have employed the use of an expert system which is a rule based system for analyzing input engine parameters according to rules describing the controlled system developed by an expert. An expert system requires an intense learning process by the expert to understand the system and to codify his knowledge into a set of rules. Thus, expert system development takes a large amount of time and resources. An expert system is not responsive to frequent design changes such as occur in automotive development. A change in engine design changes the rules, which requires the expert to determine the new rules and to redesign the system.

U.S. Pat. No. 4,252,013, issued to Hyanova et al, discloses a diagnostic system for an internal combustion engine in which pick-up devices sense engine parameters. Dynamic input signals are preprocessed in order to provide quasi-static indices of engine conditions. The preprocessed signals and other measured signals are applied to predetermined algorithms to give diagnostic indices of the internal combustion engine.

U.S. Pat. No. 4,375,672, issued to Kato et al, discloses a computerized engine analyzer for making automatic diagnosis. Sensors connected to an internal combustion engine detect characteristics of the engine. The signals from the sensors are preprocessed and are then compared in a computer with a preset program corresponding to the engine. The results of various diagnoses of the engine are indicated as the diagnosis proceeds under control of an operator.

U.S. Pat. No. 4,418,388, issued to Allgor et al, discloses an engine analyzer which measures engine operating parameters including electrical system waveforms which are then stored in the memory. The stored waveforms are compared to analytical matrices dictated by engine type. Based on the preprogrammed relationship of matrix locations and the input waveforms, information is processed to identify defective systems.

U.S. Pat. No. 4,424,709, issued to Meier Jr. et al, discloses an engine analyzer for identifying engine defects based on signals from various sensors. The detected signals are compared with signals from normal engines in the frequency domain. By recognizing specific differences, or looking for abnormal frequency components, engine defects are identified.

An expert system for car fault diagnosis is described in Armano et al, *Empirical And Functional Knowledge In An Expert System For Fault Diagnosis*, IEEE International Workshop on Artificial Intelligence for Industrial Applications, pages 109–114 (1988). The expert system architecture disclosed in this paper uses artificial intelligence techniques to incorporate both empirical knowledge and functional knowledge to reach a fault diagnosis.

The use of failure detection filters to diagnose automotive control systems is disclosed in Liubakka et al, *Failure Detection Algorithms Applied To Control System Design For Improved Diagnostics And Reliability*, SAE Technical Paper Series, Paper No. 880726 (1988). The failure detection and isolation method disclosed employs a system model for predicting system operation. Known relationships between system inputs and outputs allow the diagnostic system to anticipate a system output given detected system inputs. Any difference between the predicted system outputs and those detected by the sensors indicates a system fault.

Each of the prior art diagnostic systems requires predetermined engine analytical information in order to design a system to detect faults. As electronic systems increase in complexity, the determination of such analytical information becomes more difficult, time-consuming, and expensive. These are some of the problems this invention overcomes.

SUMMARY OF THE INVENTION

It is a principal object of the present invention to diagnose operation of an electrical control system without requiring detailed analytical modeling of the system.

It is another object of this invention to provide a diagnostic system for detecting faults in complicated electronic control systems which is inexpensive to develop and provides accurate results.

It is a further object of the invention to provide a method for identifying selected conditions in a combustion engine using pattern recognition and for training a pattern recognition system to recognize the selected conditions.

It is still another object of the invention to provide an apparatus for identifying possible fault conditions in an internal combustion engine by employing a pattern recognizer which can be easily adapted to different engines.

These and other objects are achieved using a method for identifying selected conditions in an electronically controlled automotive system wherein a trainable pattern recognition system (such as a neural network) is employed according to the teachings of the invention. Specifically, a plurality of system operating trials are conducted using a test system, each trial including at least one respective one of a plurality of known selected conditions, such as fault conditions. System operating data is collected during the operating trials corresponding to a plurality of system parameters, the parameters including signals passing to and from an electronic control and calculated quantities derived therefrom. In the embodiment where the controlled system is a combustion engine, the parameters include measurements and calculations for each individual firing event during operation of the engine. System parameters and corresponding known system fault identities are input as training vectors to the pattern recognition system. During training, the pattern recognition system learns to correlate patterns in the system parameters with respective system faults. Subsequently, a system operating trial is conducted using a system to be diagnosed. The system diagnostic data corresponding to the system parameters is collected and the parameters based on the diagnostic data are input as input vectors to the pattern recognition system to identify those selected conditions which are present in the operation of the system to be diagnosed.

The invention further includes apparatus, for identifying possible fault conditions in an automotive system, that comprises monitor means, processing means, memory means, and pattern recognition means. The monitor means is adapted to be coupled to the system for collecting a plurality of time referenced values corresponding to selected system parameters during operation of the system, the parameters including signals passing to and from the system. The processing means is coupled to the monitor means for processing the values to derive system parameters and organizing the system parameters into vectors. The memory means is coupled to the processing means for storing the vectors. The pattern recognition means is coupled to the memory means for classifying the stored vectors according to the possible fault conditions. The time referenced values may include digital values and analog values, the digital values being monitored upon occurrence of a transition therein, and the analog value being monitored at predetermined intervals.

BRIEF DESCRIPTION OF THE DRAWINGS

The novel features of the invention are set forth with particularity in the appended claims. The invention itself, however, both as to its organization and method of operation, together with further objects and advantages thereof, may best be understood by reference to the following description taken in conjunction with the accompanying drawings, in which:

FIG. 3 is a block diagram showing a data acquisition system connected to an engine and its electronic control.

FIG. 5 is a functional block diagram showing processing of engine operating data to generate engine parameters for applying to the pattern recognition system.

FIG. 6 is a matrix of parameter vectors for application to a pattern recognition system.

DETAILED DESCRIPTION OF PREFERRED EMBODIMENTS

The present invention enables diagnosis of faults in a variety of electronically controlled electromechanical systems. Fault diagnosis is performed as a passive observer of system operation using only the information that is available within the system while it is operating. Furthermore, by proper selection of system parameters to be observed, high accuracy in failure detection is achieved by means of a pattern recognition system. The preferred embodiment and best mode of the invention specifically relates to fault diagnosis in an electronically controlled internal combustion engine, as is described below.

The electronically controlled internal combustion engine is a complex system in which high speed analog and digital signals are sent to and from the electronic control during engine operation. Some characteristics of a high speed data acquisition system for collecting the analog and digital data from sensors and actuators in an electronically controlled engine are given in James et al, *Microprocessor Based Data Acquisition For Analysis Of Engine Performance*, SAE Technical Paper Series, Paper No. 870386 (1987).

The amount of data collected by such a data acquisition system, even during a single engine cycle, is very large. Furthermore, the variations between data from normal engine operation and faulty engine operation can be subtle. Therefore, it can be very difficult to train a technician to associate each pattern with a specific engine fault. Likewise, developing an explicit algorithmic computer program or creating an expert system to perform the association can only be done with great effort and expense.

In accordance with the present invention, a pattern recognition system such as a neural network simulation program used in conjunction with the high speed data acquisition system can produce a diagnostic system which can be trained to correlate signatures of improper engine performance with causes of faults. During training of the pattern recognition system, an engine is operated in a service bay with known faults, i.e. bugs, with each operating trial being tagged according to the fault introduced. Data from a normal (i.e., unbugged) engine is also included. Subsequently, an engine operating with a previously unidentified fault can be identified using the trained system.

Figure 1:
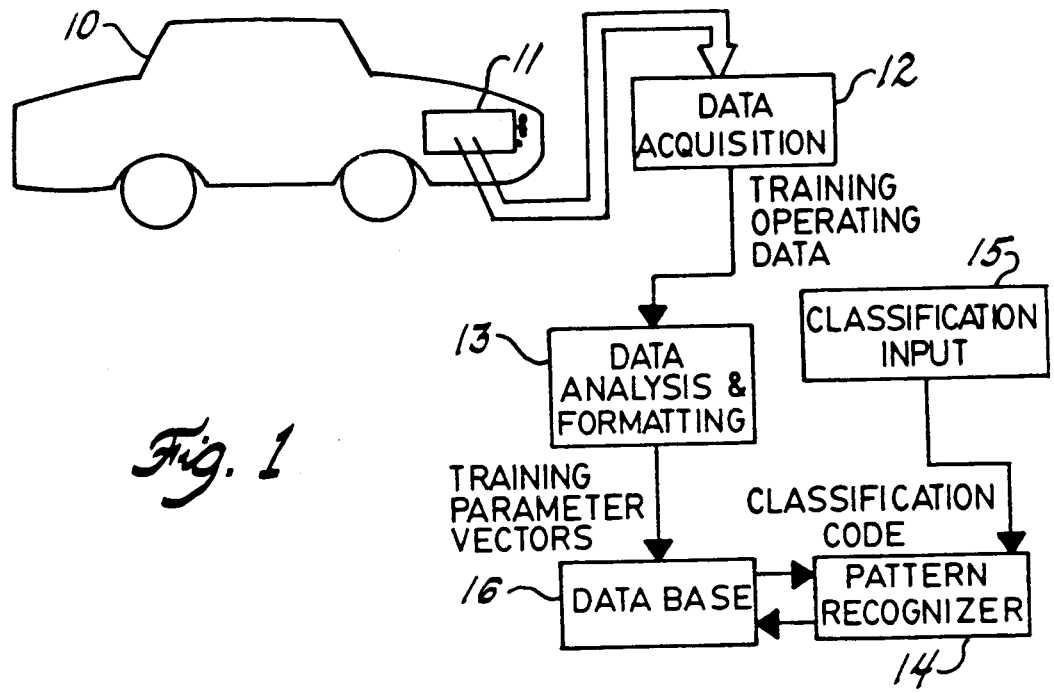
FIG. 1 is a functional block diagram showing a pattern recognition system during training to recognize selected conditions in an engine.

Referring now to FIG. 1, an automobile 10 includes an electronically controlled engine 11. Operating data in the form of electrical signals associated with an electronic controller in engine 11 are collected by a data acquisition unit 12 which provides the operating data to a data analysis and formatting unit 13. At least one parameter vector is provided from unit 13 to a pattern recognizer 14 in conjunction with an engine condition classification from a classification unit 15. Pattern recognizer 14 is coupled to a data base 16 which is built up during training of the system.

Figure 2:
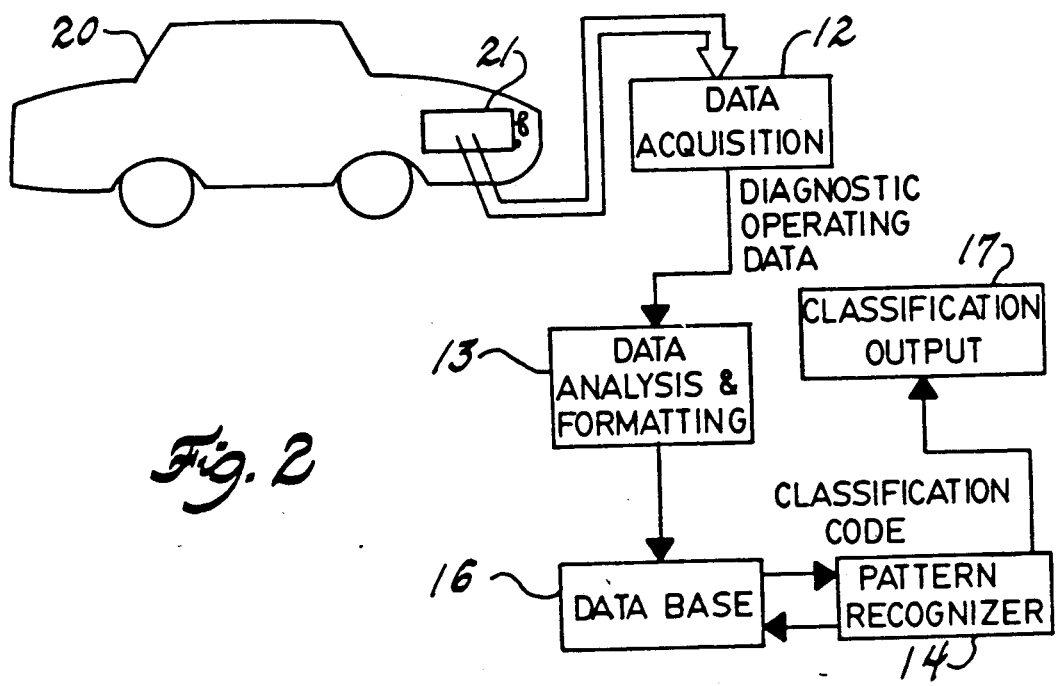
FIG. 2 is a functional block diagram showing detection of the selected conditions in an engine to be diagnosed by a trained pattern recognition system.

FIG. 2 corresponds to operation of the diagnostic system after training for the purpose of identifying the condition of an engine. An automobile 20 includes an electronically controlled engine 21 to be diagnosed which is substantially identical to engine 11 which was employed during training. Diagnostic operating data is obtained by data acquisition unit 12 and provided to data analysis and formatting unit 13. A diagnostic parameter vector is provided to pattern recognizer 14 which classifies the vector according to the trained data base 16. A classification output is provided at 17 corresponding to the attempted classification of the operating condition of engine 21.

Functional blocks 13–17 of FIGS. 1 and 2 can preferably be implemented with a computer such as a PC or an on-board microcomputer, such as in the electronic engine control itself.

The training of the system, as shown in FIG. 1, requires the compilation of a large data base from test engine 11 which is first monitored while operating properly and then with known "bugs" created by a technician. The technician creates various faults in the vehicle while the computer acquires, analyzes, and formats the results for inclusion in the data base, along with a coded classification of the particular cause of the fault, provided by the technician.

The operating data acquired from the engine can be used in calculations to determine exact engine operating parameters. The parameters and the fault classifications are formatted as multidimensional vectors. Preferably, each parameter vector contains at least 52 performance parameters for a single cycle of a six cylinder engine. Since statistical fluctuations can cause variations in exact parameter values, preferably at least 16 vectors are stored for each test condition of engine 11. The utility and accuracy of the system is strongly influenced by the representation chosen both for fault identification codes generated as output during diagnosis and for engine operating parameters used in the parameter vector's input to pattern recognizer 14. Using the particular engine parameters and the selected fault conditions described below, not only the engine cylinder at fault but also the nature of the fault, including indications of faulty components and indication of components that are functioning properly, can be obtained. The diagnostic system is very precise in identifying faults and accomplishes the identification of multiple simultaneous faults under many conditions.

Continuing with the operation of the system shown in FIGS. 1 and 2, after a large data base of fault information has been gathered and formatted by data analysis and formatting unit 13, pattern recognizer 14 and data base 16 undergo training. During training, the system recursively adjusts its internal structure until the system has learned the proper association between parameter vectors from an engine and fault classifications introduced through the classification input. The trained system parameters are saved in data base 16 and the trained system may then be presented with new data from engine 21. No classification input is presented to the system, since the system is expected to classify the new data according to previous classifications. The classification output from the system can be an indication of proper engine operation, an identification of one or more classified conditions which were introduced during training, or an indication of an inability to recognize any trained condition.

For powertrain diagnostics, the data acquired from the vehicle is based upon the signals communicated between the on-board electronic engine control (EEC) and the powertrain (engine). The set of signals captured for analysis is based upon a determination of the information that is necessary for accurate diagnosis and upon the ability of the data acquisition system to acquire and store the signals. The information used for data acquisition, training and diagnosis preferably includes the following signals and calculated parameters:

Engine Crankshaft Position Marker

The engine crankshaft position is sensed by the Profile Ignition Pickup (PIP) sensor located on the distributor shaft. The PIP signal is a digital signal which changes level at 10 degrees before top-dead-center (10° BTDC) on each firing cylinder for every engine cycle (two complete revolutions of the crankshaft for a 4-stroke engine). PIP is the primary source of information about engine performance during each cycle, since we can derive the parameters of crankshaft velocity and acceleration from it by taking the appropriate derivatives. In another embodiment, this signal is derived from a sensor directly monitoring the crankshaft with a higher sampling rate. The greater accuracy of a high data rate sensor improves sensitivity of the system in detecting engine roughness caused by faulty components.

Engine Speed (RPM)

Based on the PIP signal, engine speed in revolutions per minute is calculated as an engine parameter.

Acceleration (ACCEL)

Based on the PIP signal or a high data rate position sensor, engine acceleration averaged over one engine cycle is calculated. Preferably, the average is determined as a median filtered value.

Cylinder Acceleration (NACCEL)

Engine acceleration during an individual cylinder firing is calculated and the difference taken from the average acceleration during the engine cycle. This parameter gives information about misfiring cylinders.

Spark Output (SPOUT)

This signal is an output from the EEC which controls the time of firing of the individual spark plugs. It is calculated by the EEC in a manner to maximize fuel economy within emissions constraints. Monitoring this signal provides an indication of proper operation of the spark strategy including the calculated parameter of actual spark advance for each cylinder firing.

Tachometer (TACH)

This signal is obtained from the primary of the ignition coil. The shape of this signal and its timing provides information on dwell (the length of time the coil is being charged) and on arc duration (the length of time a spark is present in the spark plug gap). Analysis of these signals in conjunction with the SPOUT signal provides diagnostic information about the ignition system and its operation.

Manifold Absolute Pressure (MAP)

This signal is an indication of the airflow into the engine and is based upon a sensor whose output typically is a frequency linearly related to the pressure in the intake manifold.

Mass Air Flow (MAF)

On some newer vehicles, airflow into the engine is measured directly by this sensor, rather than inferred from manifold pressure (MAP) and other parameters. The output of this sensor may be an analog voltage whose value is proportional to the mass of air flowing into the engine.

Air Charge Temperature (ACT)

An analog voltage output from this sensor provides information on the temperature of the incoming air and is used by the EEC to estimate the air density in calculating the amount of air flowing into the engine.

Throttle Position (TP)

This sensor monitors the position of the vane controlling air admission to the engine under the command of the driver through the linkage to the accelerator pedal. It is an analog voltage proportional to the degree of throttle opening.

Pressure Feedback Exhaust Gas Recirculation (PFE)

This signal is derived from a pressure sensor on the exhaust side of the exhaust gas recirculation (EGR) valve which is controlled by the electronic vacuum regulator (EVR) signal from the EEC. Correlating this PFE signal with the EVR controlling signal from the EEC can be used to diagnose improper operation of the EGR system, as well as to detect the presence of other engine faults such as defective valves.

Injector Control Pulses (INJ)

These signals are delivered to the fuel injectors and control the timing and the amount of fuel (pulse width) delivered to each cylinder. These signals provide timing and pulse with information to diagnose the operation of the fuel delivery system.

Exhaust Gas Oxygen (HEGO)

This sensor has an output which is substantially binary in its response to the presence or absence of oxygen in the exhaust gas. Proper system operation regulates the engine so that the mixture is, on average, neither rich nor lean. When the mixture transits from rich to lean, the output of this sensor changes abruptly. The output of this sensor is used by the EEC to control the mixture ratio so that the sensor is constantly switching between its two states, indicating that the mixture is near stoichiometric.

Idle Speed Control (ISC)

This signal from the EEC is a duty cycle modulated pulse which opens an air bypass valve against a spring to regulate the idle speed of the vehicle. Correlating the ISC signal with the idle speed variations and MAP provides a means of diagnosing faults in the ISC system.

Engine Coolant Temperature (ECT)

This is the output of a sensor in the cooling fluid in the engine which is an analog voltage proportional to the cooling system temperature. This signal is used in the EEC control system to activate a cold engine strategy and to control the cooling system to maintain proper engine temperature after warm-up.

Knock Sensor

This is the output of a sensor used in some high performance engines to detect the presence of engine knock. The signal is used to regulate the spark timing to avoid continuous engine knock which could damage the engine if it continued for long periods of time.

Vehicle Speed Sensor (VSS)

This sensor provides an output proportional to the driveshaft speed for regulating vehicle speed by speed-control system, often incorporated into the EEC.

Vehicle Battery Voltage (VBAT)

This is an EEC signal proportional to the battery voltage in the car.

Turning now to FIG. 3, the connection of data acquisition system 12 to an electronically controlled engine is shown for rapidly gathering the large amount of data required to assess vehicle performance. An engine 26 includes a plurality of sensors 28 and a plurality of actuators 29. An electronic engine control (EEC) 25 communicates with sensors 28 and actuators 29 over communication lines 27. Data acquisition system 12 monitors signals on lines 27 by means of a plurality of signal lines 30. Data acquisition system 12 acquires and stores signals being communicated to and from EEC 25 at a sufficiently high rate such that various parameters of engine performance at the actual level of firing events can be determined. One possible approach for acquiring engine data suitable for the present invention is discussed in the paper James et al, *Microprocessor Based Data Acquisition For Analysis Of Engine Performance,* SAE Technical Paper Series, Paper No. 870386 (1987), mentioned earlier.

Figure 4:
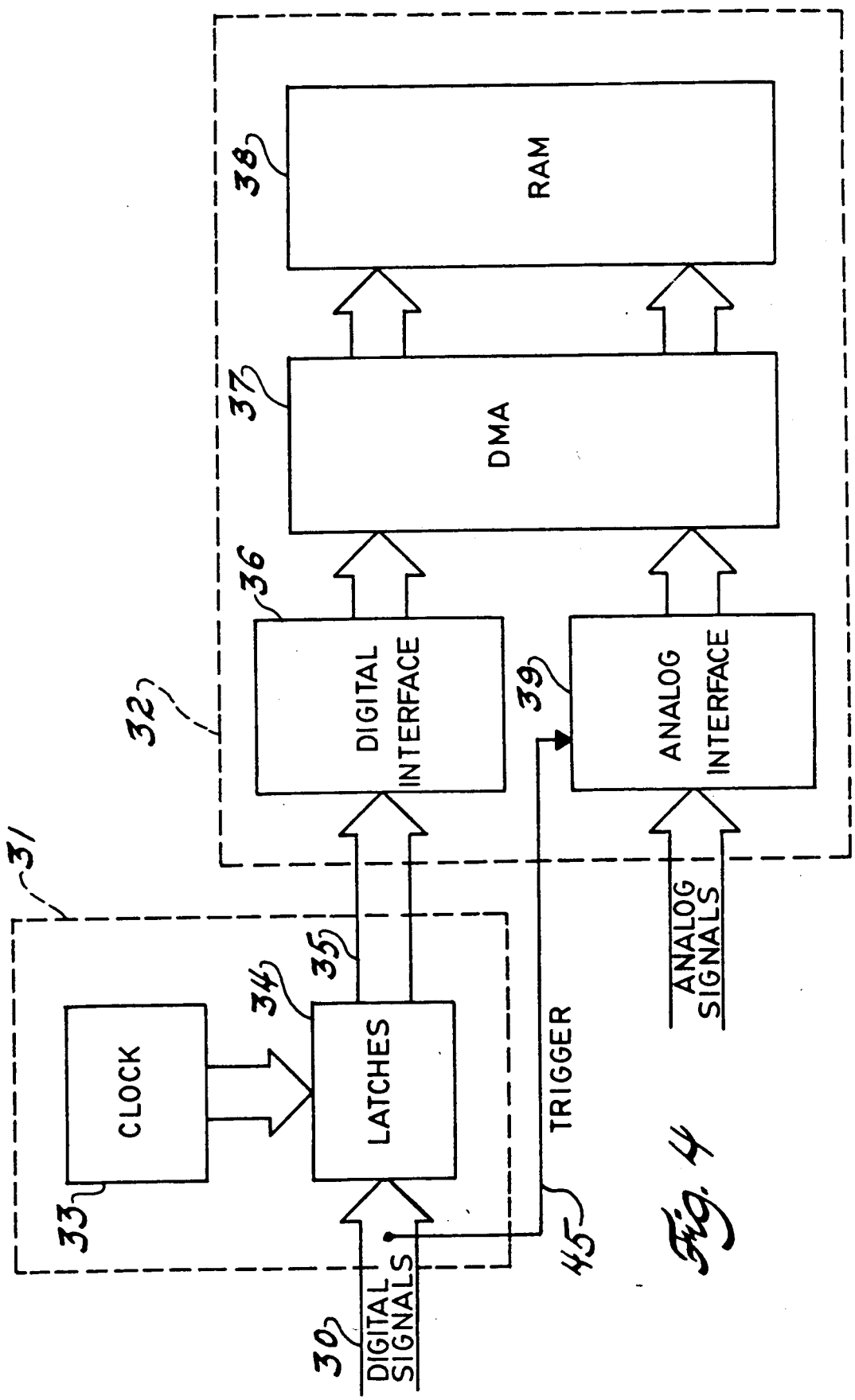
FIG. 4 is a block diagram showing the data acquisition means as part of a computerized fault detection system of the invention in greater detail.

A preferred embodiment for implementing data acquisition system 12 is shown in FIG. 4. Data is acquired and stored according to a timestamping procedure. As described in the above-referenced article, timestamping of digital signals only records changes which occur on any of the lines being monitored along with the time that the change occurs.

As shown in FIG. 4, the signal acquisition lines 30 are separated according to digital signals and analog signals. The digital signals are coupled to a timestamping board 31 including clock 33 and latches 34. Latches 34 are coupled via output lines 35 to a digital interface 36 in a microcomputer 32. Analog signals from lines 30 are coupled to an analog interface 39 also in microcomputer 32. Digital interface 36 and analog interface 39 are each coupled to a direct memory access (DMA) unit 37 which controls direct memory transfer to a random access memory (RAM) 38. A selected digital line from digital signals 30 is connected to analog interface 39 over a line 45 for acting as a trigger of analog measurements as discussed below.

In operation, digital signals from lines 30 are monitored by latches 34 such that the previously timestamped values (or initial values taken when monitoring begins) are compared with the current values. Upon a change in any digital value, a new timestamped output consisting of the value of each digital line (or identification of the line or lines that changed) is output over lines 35 along with the clock value at the time the change occurred. The new timestamped digital values are processed by digital interface 36 and transferred via DMA 37 such that the values and time signature are stored in RAM 38 in substantially real-time. Preferably, the transfer of timestamped data occurs at a speed which allows a resolution in timestamped data of about two microseconds.

Analog signals from lines 30 are likewise stored in association with a timestamping signal. According to the present embodiment, analog signals are measured upon each occurrence of a particular substantially periodic digital signal from the digital lines 30. In particular, for electronically controlled engine applications, the trigger for taking analog measurements is preferably a transition of an engine position signal such as the PIP described earlier. In response to the trigger pulse on line 45, analog interface 39 samples a plurality of analog signals substantially simultaneously. They are then converted to digital signals by analog-to-digital converters within the interface. The digitized signals are provided via DMA 37 and are stored in RAM 38 in association with the digital timestamped signals occurring simultaneously. Thus, the analog signals can be correlated to the clock reading coinciding with the digital timestamped output including the trigger pulse. Once a sufficient amount of data is contained in RAM 38, microcomputer 32 is free to process the data in order to calculate various engine operating parameters or other values. Such processing may begin after completion of data acquisition or may be performed concurrently with data acquisition in order to diagnose engine conditions in real time.

Subsequent processing of data can be performed according to the diagram in FIG. 5. Time-referenced data 40 can be input to a number of calculations 41. The output of calculations 41 and some unchanged data (e.g., from analog sensors) are input to a formatting section 42 which operates to organize the engine operating data and parameters into a parameter vector appropriate for input to the pattern recognition system.

FIG. 6 shows a plurality of training vectors for training of the pattern recognition system. A first parameter vector X1 consists of a plurality of individual parameter values $x_{l,l}$ to $x_{l,n}$. FIG. 6 shows m parameter vectors (X1 to Xm) where m is a sufficient number to adequately train the pattern recognition system to accurately recognize the preselected conditions. The individual parameter values $x_l$ to $x_n$ are preferably comprised of the parameters discussed above, including cylinder number, engine speed, acceleration, spark timing, spark duration, dwell, mass airflow, throttle position, feedback exhaust gas recirculation pressure, fuel injector pulse width, exhaust gas oxygen content, idle speed control duty factor, engine temperature, knock, vehicle speed, and battery voltage. Each parameter corresponds to an individual firing event, i.e., to a particular PIP signal. Although some of the digital signals obtained from timestamping are synchronous with the PIP signal, most are not. All digital transmissions are collected as they occur, but in post-processing, the relevant engine parameters are calculated from the digital signals associated with the PIP interval nearest in time. The parameters are determined once per engine firing, and information from several engine firings provides the plurality of training vectors X1 to Xm. Some parameters known to be slowly varying (e.g., various temperatures) can be averaged over the full engine cycle to yield a single value for inclusion into a vector in order to avoid unnecessarily large vectors.

Figures 7, 8:
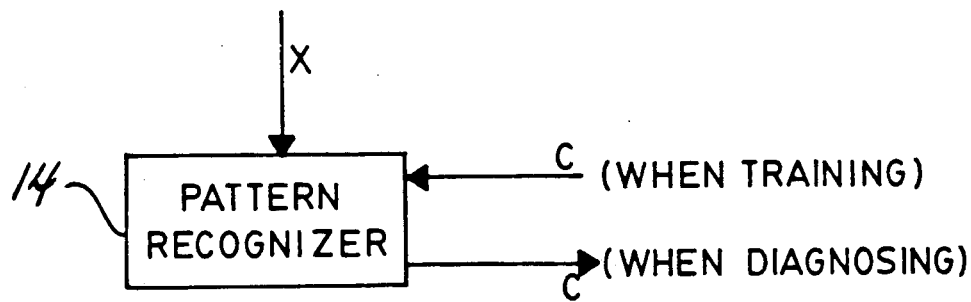
FIG. 7 is a block diagram showing the inputs and outputs for the pattern recognizer of the invention.
FIG. 8 illustrates the matrix of combinations of parameter vectors and condition classification codes during training of the pattern recognition system.

Multiple sets of training vectors X1 to Xm are obtained corresponding to selected engine operating conditions. Each set corresponds to either normal operation or operation under a fault condition. As shown in FIG. 7, pattern recognizer 14 receives a parameter vector X simultaneously with a condition code C during training. When m is equal to 16, then 16 parameter vectors X will be presented to pattern recognizer 14 along with a single condition code C. For the next operating condition being presented to pattern recognizer 14, a different set of 16 parameter vectors X are presented simultaneously with a new condition code C. Once training is complete, only a single parameter vector X need be presented to pattern recognizer 14 which then outputs one or more condition codes C corresponding to engine conditions recognized within the parameter vector.

FIG. 8 shows the combination of inputs to pattern recognizer 14 for training on a number of conditions C1 to Cy. For example, an electronically controlled engine is operated under a first fault condition C1. Preferably, the engine is operated at a steady speed. Data is obtained corresponding to a plurality of engine firings sufficient to construct m parameter vectors. Next, the engine is operated with a new induced fault C2 while timestamped data is obtained to construct a new set of parameter vectors X1 to Xm. The process is repeated until the last fault or normal operating condition Cy is obtained.

Once the full set of parameter vectors is completed, they are mated to their corresponding condition code as shown in FIG. 8 and presented to pattern recognizer 14. For improved speed and accuracy of training, it is preferable to present the training vectors to pattern recognizer 14 in a randomized order, i.e., not all of the vectors corresponding to a respective fault condition are presented sequentially. The internal reorganization of the pattern recognition data base converges to a proper configuration more efficiently when such a random order of vectors is used. Furthermore, several passes through the sets of vectors may be required to achieve a desired level of accuracy.

Preferably, the operating conditions for which training occurs on an electronically controlled engine includes both cylinder specific faults, cylinder independent faults, and a normal operating condition. The cylinder specific faults preferably include, at least, a shorted spark plug, an open spark plug, and a clogged fuel injector. Cylinder independent faults preferably include a shorted manifold absolute pressure sensor, an open manifold absolute pressure sensor, a shorted exhaust gas oxygen sensor, an open exhaust gas oxygen sensor, and idle speed control duty cycle faults. Additional fault conditions can include intake and exhaust valve train faults such as valves open or closed, head gasket leaks, partial clogging of fuel injectors, fouled spark plugs, uneven air/fuel mixture among cylinders, and improper fuel injection phasing. Although parameter vectors are conveniently collected for each fault in isolation, it is possible for pattern recognizer 14 to identify simultaneous fault occurrences even though no training data was taken with simultaneous occurrence of the same faults. Furthermore, with proper training, the system recognizes and identifies a specific cylinder where a cylinder specific fault has occurred.

The present invention has been implemented for a six-cylinder electronically controlled engine. A parameter vector including 52 individual parameters (both one-per-firing and once-per-cycle) was used. In this implementation, 26 different operating conditions (both cylinder specific and non-cylinder specific) were observed with the engine operating at about 1000 rpm. The training set consisted of 16 parameter vectors for each condition (e.g., failure) introduced. After training, as little as one parameter vector from an engine to be diagnosed is all that is required by the pattern recognizer for correct classification.

In a preferred embodiment, the pattern recognizer system included a backpropagation method for learning patterns and classifications. Such mathematical pattern recognition algorithms are well known in the art. In another preferred embodiment, the pattern recognizer comprised the Nestor NDS-1000 System available from Nestor Incorporated, New York, New York. After complete training, the Nestor system obtained 100% accuracy in identifying the operating condition of an engine being diagnosed.

In implementing the entire system using pattern recognition software, a microcomputer is employed for linking computer recognition software (e.g., a backpropagation program or the Nestor software) into a larger program which performs data acquisition and data formatting and preparation, such as cycle binning, normalization, and scaling. Although the time for manually collecting parameters according to all the engine conditions to be recognized can take several hours, the training vectors are learned by the pattern recognition system in about 5-10 minutes. This, faults are then reintroduced at a later time and can be recognized by the system of the present invention without any modeling or other detailed knowledge of the operation of the engine system. Any modification to the engine requires that new data be taken and the system be retrained. However, the reformulation of detailed rules which would be required by an expert system are avoided.

The present invention has been implemented using primarily commonly available hardware and software. Thus, an effective and efficient technique has been provided for proper diagnosis of electronic systems. Furthermore, the system is readily transferable to systems on-board an electronic engine control for continuous diagnosis of engine operation in a vehicle.

Although the separate sensing of signals passing to and from an EEC has been shown in the preferred embodiment, many of the calculated values may be available from calculations being performed in the EEC itself (e.g., spark timing and RPM). Rather than duplicate such calculations, it is possible to obtain these parameters from the ECC over a data communication link or other data port if one is provided in the EEC. Another possible modification of the invention involves the use of a vector which contains information from multiple cycles. This allows additional fault conditions to be recognized such as idle hunting.

While preferred embodiments of the invention have been shown and described herein, it will be understood that such embodiments are provided by way of example only. Numerous variations, changes, and substitutions will occur to those skilled in the art without departing from the spirit of the invention. Accordingly, it is intended that the appended claims cover all such variations as fall within the spirit and scope of the invention.

What is claimed is:

1. A method for identifying selected conditions in an electronically controlled automotive system comprising the steps of:
   conducting a plurality of system operating trials using a test system, each trial including at least one respective one of a plurality of known selected conditions;
   collecting system operating data during said operating trials corresponding to a plurality of system parameters, said operating data including signals passing to and from an electronic control;
   inputting said system parameters and corresponding known system fault identities as training vectors to a trainable pattern recognition system;
   recursively adjusting said pattern recognition system to converge to a configuration of said pattern recognition system for matching input vectors with said system fault identities;
   conducting a system operating trial using a system to be diagnosed;
   collecting system diagnostic data corresponding to said plurality of system parameters; and
   inputting said system parameters based on said diagnostic data as input vectors to said pattern recognition system to identify said selected conditions.

2. The method of claim 1 wherein said pattern recognition system performs a neural network simulation.

3. A method for identifying selected conditions in a combustion engine comprising the steps of:
   conducting a plurality of engine operating trials using a test engine, each trial including at least one respective one of a plurality of known selected conditions;
   collecting engine operating data during said operating trials corresponding to a plurality of engine parameters, said parameters including individual firing events;
   inputting said engine parameters and condition codes as training vectors to a trainable pattern recognition system, each condition code identifying one of said selected conditions;
   recursively adjusting said pattern recognition system to converge to a configuration of said pattern recognition system for matching input vectors with said condition codes;
   conducting an engine operating trial using an engine to be diagnosed;

collecting engine diagnostic data corresponding to said plurality of engine parameters; and inputting said engine parameters based on said diagnostic data as input vectors to said adjusted pattern recognition system to generate at least one condition code corresponding to one of said selected conditions present in said engine to be diagnosed.

4. The method of claim 3 wherein said selected conditions include a proper running condition of said combustion engine and conditions corresponding to fault conditions causing improper operation of said combustion engine.

5. The method of claim 3 further comprising the steps of:

calculating at least one of said engine parameters in said training vectors from said engine operating data; and calculating at least one of said engine parameters in said input vectors from said diagnostic data.

6. The method of claim 3 wherein said test engine and said engine to be diagnosed include an electronic engine control and wherein said engine parameters are derived from input signals to and output signals from said electronic engine control.

7. The method of claim 6 wherein said input signals and said output signals include both analog and digital representations.

8. The method of claim 3 wherein said parameters include engine conditions averaged over a predetermined time period.

9. The method of claim 8 wherein said predetermined time period is one engine cycle.

10. The method of claim 8 wherein said averaged conditions include idle speed control duty cycle.

11. The method of claim 8 wherein said averaged conditions include engine speed.

12. The method of claim 8 wherein said averaged conditions include engine acceleration.

13. The method of claim 8 wherein said averaged conditions include throttle position.

14. The method of claim 3 wherein said parameters include engine conditions determined once per cylinder firing.

15. The method of claim 14 wherein said conditions determined once per engine cycle include air charge temperature.

16. The method of claim 14 wherein said conditions determined once per engine cycle include engine coolant temperature.

17. The method of claim 3 wherein said pattern recognition system is comprised of a microcomputer programmed to perform a neural network simulation.

18. The method of claim 3 wherein said pattern recognition system is comprised of a microcomputer programmed to perform a backpropagation analysis.

19. The method of claim 3 wherein said firing events include spark advance for each engine cylinder.

20. The method of claim 3 wherein said firing events include spark duration for each engine cylinder.

21. The method of claim 3 wherein said firing events include manifold absolute pressure.

22. The method of claim 3 wherein said firing events include engine position.

23. The method of claim 3 wherein said firing events include deviation of acceleration of a single cylinder from average acceleration over one engine cycle.

24. The method of claim 3 wherein said firing events include exhaust gas oxygen content.

25. The method of claim 3 wherein said firing events include exhaust gas recirculating pressure.

26. The method of claim 3 wherein said firing events include each fuel injector pulse width.

27. The method of claim 3 wherein said firing events include each fuel injector pulse timing.

28. The method of claim 3 wherein each of said vectors includes engine parameters corresponding to each cylinder firing within a single engine cycle.

29. Apparatus for identifying possible fault conditions in a combustion engine comprising:

monitor means for collecting a plurality of time-referenced values corresponding to selected engine parameters during operation of said engine, said parameters including individual firing event information;

processing means coupled to said monitor means for processing said values to derive said engine parameters and organizing said engine parameters as vectors;

memory means coupled to said processing means for storing said vectors; and pattern recognition means coupled to said memory means for classifying said stored vectors according to said possible fault conditions.

30. The apparatus of claim 29 wherein said pattern recognition means includes a data base derived from a plurality of test vectors corresponding to said selected engine parameters collected during operation of a test engine for a plurality of trials, said trials including a plurality of known engine faults.

31. The apparatus of claim 29 wherein said time-referenced values include digital values and analog values, said digital values being monitored upon occurrence of a transition therein, and said analog values being monitored at predetermined intervals.

32. The apparatus of claim 29 wherein said pattern recognition means is comprised of a neural network.

33. The apparatus of claim 29 wherein said pattern recognition means performs a back propagation analysis.

34. The method for identifying selected conditions in a combustion engine comprising the steps of:

conducting a plurality of engine operating trials using a test engine, each trial including at least one respective one of a plurality of known selected conditions;

collecting engine operating data during said operating trials corresponding to a plurality of engine parameters, said parameters including individual firing events, said individual firing events including deviation of acceleration of a single cylinder from median filtered acceleration over one engine-cycle;

inputting said engine parameters and respective condition codes are training vectors to a pattern recognition system to correlate patterns in said engine parameters with respective selected conditions;

conducting an engine operating trial using an engine to be diagnosed;

collecting engine diagnostic data corresponding to said plurality of engine parameters; and inputting said engine parameters based on said diagnostic data as input vectors to said pattern recognition system to generate at least one condition code corresponding to one of said selected conditions present in said engine to be diagnosed.

35. Apparatus for identifying selected conditions in a combustion engine comprising:

trial means for conducting a plurality of engine operating trials using a test engine, each trial including at least one respective one of a plurality of known selected conditions;

data means coupled to said trial means for collecting engine operating data during said operating trials corresponding to a plurality of engine parameters, said parameters including individual firing events;

pattern recognition means for receiving said engine parameters and condition codes as training vectors and for recursively adjusting to a configuration of said pattern recognition means for matching input vectors with said condition codes, each condition code identifying one of said selected conditions; and operating means coupled to said pattern recognition means for collecting engine diagnostic data corresponding to said plurality of engine parameters in an engine to be diagnosed;

said engine parameters based on said diagnostic data being input as input vectors to said adjusted pattern recognition means to generate at least one condition code corresponding to one of said selected conditions present in said engine to be diagnosed.

* * * * *